United States Patent
Ano

(10) Patent No.: US 7,829,389 B2
(45) Date of Patent: Nov. 9, 2010

(54) ROLL-ON ENCAPSULATION METHOD FOR SEMICONDUCTOR PACKAGES

(75) Inventor: Kazuaki Ano, Hijo-machi-gun (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/243,238

(22) Filed: Oct. 1, 2008

(65) Prior Publication Data

US 2009/0093088 A1    Apr. 9, 2009

Related U.S. Application Data

(60) Provisional application No. 60/977,725, filed on Oct. 5, 2007.

(51) Int. Cl.
*H01L 21/44* (2006.01)
(52) U.S. Cl. .............. 438/127; 438/112; 438/113; 438/124; 438/126
(58) Field of Classification Search .......... 438/112, 438/113, 114, 118, 124, 126, 127
See application file for complete search history.

(56) References Cited

U.S. PATENT DOCUMENTS

| | | | |
|---|---|---|---|
| 3,915,780 A | * | 10/1975 | Broussard et al. .......... 156/243 |
| 3,958,039 A | * | 5/1976 | Yabuki et al. .......... 427/58 |
| 6,248,199 B1 | * | 6/2001 | Smulson .......... 156/244.12 |
| 6,627,477 B1 | | 9/2003 | Hakey et al. |
| 6,979,593 B2 | * | 12/2005 | Kawakami .......... 438/110 |
| 2005/0205996 A1 | * | 9/2005 | Usui et al. .......... 257/744 |
| 2006/0158804 A1 | * | 7/2006 | Usui et al. .......... 361/58 |

FOREIGN PATENT DOCUMENTS

| | | |
|---|---|---|
| JP | 2005286246 A | 10/2005 |
| JP | 2006117919 A1 | 5/2006 |

* cited by examiner

*Primary Examiner*—Kevin M Picardat
(74) *Attorney, Agent, or Firm*—Yingsheng Tung; Wade J. Brady, III; Frederick J. Telecky, Jr.

(57) ABSTRACT

A low-viscosity resin is deposited using an apparatus with a movable and heatable wheel and a heater stage. A tape is provided, which includes a layer (140) of an adhesive polymeric resin and a film (141) of an inert plastic compound. The tape is wrapped around the wheel (150) so that the film touches the wheel and the layer faces away from the wheel. The wheel is heated to a temperature high enough to transits the polymeric resin into a low-viscosity state. A substrate strip (110), which has been assembled with a plurality of semiconductor chips (101) connected to the substrate by bonding wires (120), is placed on a station (130) also heated to the transition temperature. The wheel is then moved to roll the low viscosity resin on the chips and wires along the strip, while the inert film is separated. The chips and wires are thus encapsulated.

4 Claims, 1 Drawing Sheet

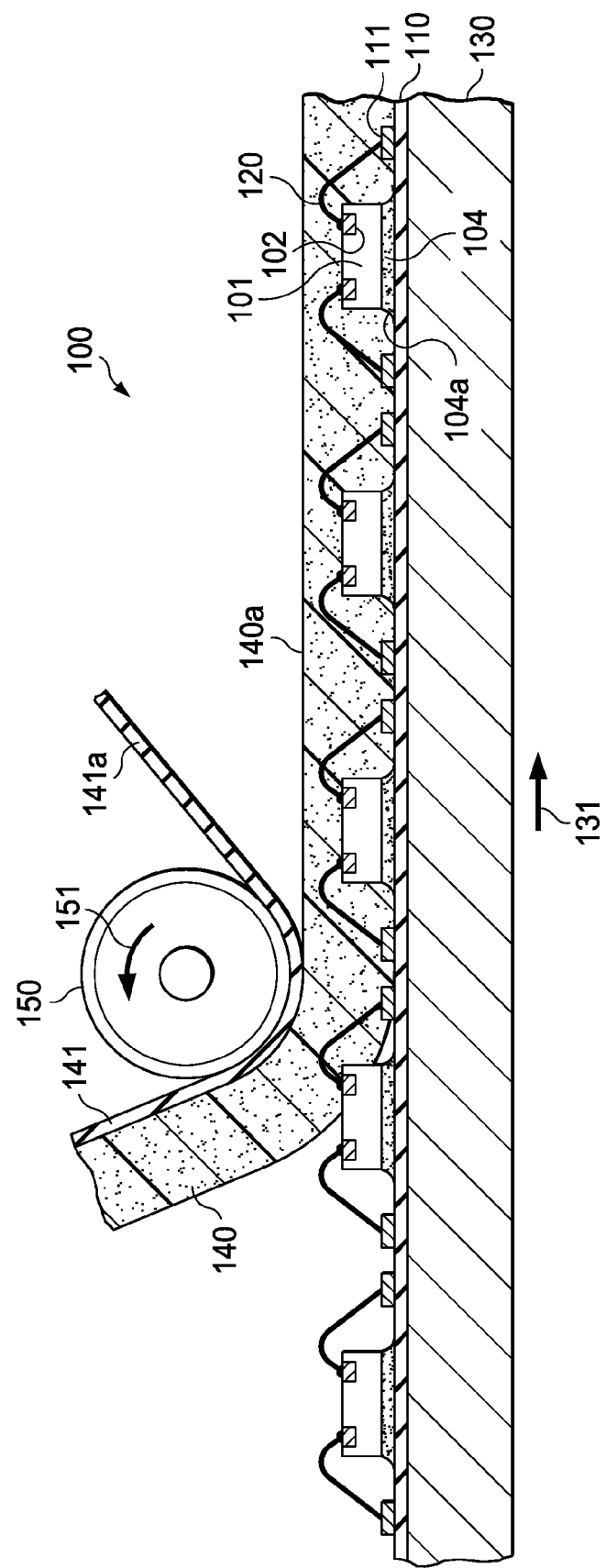

ROLL-ON ENCAPSULATION METHOD FOR SEMICONDUCTOR PACKAGES

RELATED APPLICATIONS

This application claims the benefit of provisional application Ser. No. 60/977,725 filed Oct. 5, 2007.

FIELD OF THE INVENTION

The present invention is related in general to the field of semiconductor devices and processes, and more specifically to the structure and fabrication method of plastic packages for semiconductor devices based on a roll-on encapsulation technique.

DESCRIPTION OF RELATED ART

Ever since its introduction in the early 1960's, the transfer molding technology has been the favored method for encapsulating semiconductor devices in plastic packages. In this method, the semiconductor chip is first assembled on a substrate such as a leadframe by physically attaching the chip to the substrate and conductively connecting the chip terminals to the substrate pads, most commonly by arching spans of bonding wire. Then, the substrate together with the assembled chip is transferred to a mold press and positioned in the mold cavity. The cavity has a precision gate, through which the semi-viscous molding compound, driven by a piston, is pressured. From the gate, the compound spreads through the cavity along a substantially linear front. The gate is designed for a uniform, gentle front progress, filling the cavity and embedding the chip, bonding wires, and substrate. Manufacturing the molds, gates, presses etc. requires precision machines and is thus expensive; as an example, a mold for about 200 device units may be about $ 250,000.

The molding compound is conventionally a formulation based on an epoxy polymer mixed with a catalyst and a hardening agent; before the molding operation, the compound is stored at low temperatures due to its partially cross-linked state. When the temperature is increased, the compound acquires a low viscosity state at the so-called glass transition temperature around 150° C. In the temperature range of about 175° C., the compound is pressured through the gate; afterwards, it polymerizes ("cures") fully in storage at temperatures of about 175° C. For most molding compound, the time required for the molding and curing steps is between 6 and 8 hours.

The epoxy polymer of the molding compound typically contains up to about 90% inorganic fillers, such as silica, in order to reduce thermomechanical stresses caused by the more than one order of magnitude difference between the coefficients of thermal expansion (CTE) of polymers and semiconductor chips. The diameters of these fillers have a distribution between about 35 and 75 µm; the fillers may be crystalline or spherical, and consequently have an abrasive effect of the precision gates of the mold cavities. As a consequence, the gates need periodic repairs or refurbishments. To refurbish the gates requires precision machines and is thus expensive; for example, to refurbish a 200-unit mold costs about $ 50,000.

The bonding wires used in a typical assembly process are made of a gold or copper alloy and have a diameter of about 25 µm. In an automated bonder, the wire is fed through a capillary of the bonder. During the bonding operation, the capillary attaches the wire to the chip, then moves the wire in an arching span to the substrate, and attaches the wire to the substrate. There are specifications how long a wire span can be for a given alloy and wire diameter, how much the wire is allowed to sag under its own weight, and how close to each other the spans can be located.

When the front of the molding compound progresses from the gate through the cavity of the mold, the compound exerts pressure on the wire spans. This pressure deflects the span sidewise, bends and tilts it in a direction away from the gate. This disturbance is commonly referred to as wire sweep. Generally, wire sweep is observed and measured by analyzing X-ray pictures from the top and the side of the molded package. Among the parameters determining wire sweep are the design of the cavity and the gate; the composition and the diameter of the bonding wire, the formulation, shelf life, and moisture content of the compound; and the compound viscosity during the cavity filling process. Specifications including molding compound formulation, chip and leadframe designs, and process conditions (temperature, pressure. time, etc.) state the maximum allowed wire sweep for a device type. For example, one general rule states that, after wire sweep, adjacent wires must still have a distance of at least two wire diameters. Another rule defines the percentage of allowed wire sweep based on the wire length employed. For instance, the allowed wire sweep may be 15% of wire length. Deviations from these rules are considered device failures; they reach for certain cases 300 to 600 ppm.

Prior to the wire bonding and molding operations, it is common practice in the step of attaching the chip to the substrate, to place a drop of a semi-liquid mixture of adhesive resin (epoxy) and catalyst on the substrate. The resin usually contains 70 to 80% inorganic fillers of small diameter (1 to 3 µm). By pressing the chip onto the drop, the liquid spreads under the chip area to form a fillet layer with a meniscus around the chip perimeter. The mixture is then allowed to polymerize and harden.

An adhesive chip attach film has recently been introduced, which can replace the method of resin dropping. The film is commercially offered by Nippon Steel Chemical, Japan, under the brand name NEX-130. In a thickness range from 30 to 130 µm, the film includes 30 weight % adhesive epoxy resin and 70 weight % silica filler. The resin viscosity drops steeply at temperatures above 30° C. and has a viscosity minimum in the temperature range from 90 to 130° C.; at temperatures above 150° C., the resin polymerizes ("cures"). In a lamination process, in which the film is applied to the wafer, the whole semiconductor wafer rests face-down on a heater stage (80° C.) and a heated roller laminates the film onto the back side of the wafer. After dicing the laminated wafer, the singulated chips are placed adhesive-layer-down on a substrate. The resin is then cured at 150° C. followed by a curing step at 180° C.

SUMMARY OF THE INVENTION

Applicant recognized that today's failure rate of 300 to 600 ppm caused by excess wire sweep during the transfer molding operation for semiconductor packages is unacceptable for the ongoing market trend towards more integrated and miniaturized semiconductor components, especially when this failure rate could get worse due to the introduction of thinner gold wires, driven by cost reduction. In addition, applicant saw that the high cost of acquiring and maintaining the molds, driven by precision tooling and gate replacement, the long lead time for mold maintenance, and the slow molding and curing processes are incompatible with the quick change of products, fast turn-around-time and productivity improvements required by the fast-moving consumer market.

Applicant solved the wire sweep, molding cost, and time problems when he discovered that he can apply the adhesive film for attaching chips as a lamination technology for encapsulating chip and wires. The method uses a sheet of epoxy-type, partially cured (B-stage), adhesive resin, which enters low viscosity when heated to the lamination temperature range; the resin then behaves like thick cream. In the encapsulation process at elevated temperatures, the sheet is gently deposited, for instance by rolling, onto the wire-bonded semiconductor chips, causing practically no stress on the wires, and consequently no noticeable wire sweep. In addition, the resin can be provided with a high content of small, rounded silica fillers, which lowers the CTE of the encapsulant towards the CTE of substrate and silicon.

Applicant demonstrated that this method lends itself to large-scale batch processing, making it a low cost manufacturing technology without the need for expensive molds and costly maintenance. In fast turn-around-time, the encapsulation compound and the package thickness can be changed from run to run, bringing hitherto unknown flexibility to the encapsulation technology. Further, test results of the fully cured products indicated that the encapsulated chips show no noticeable delamination after numerous temperature cycles, and the devices have excellent reliability characteristics in moisture and stress tests.

As an additional advantage, applicant invented a methodology to coordinate deposition techniques for both the chip attachment and the chip encapsulation steps, including the compound curing cycles, applicable when using different compound formulations for the different steps.

In an embodiment, the deposition of the low-viscosity resin employs an apparatus with a movable and heatable wheel and a heater stage. A tape is provided, which includes a layer of an adhesive polymeric resin and a film of an inert plastic compound. The tape is wrapped around the wheel so that the film touches the wheel and the layer faces away from the wheel. The wheel is heated to a temperature high enough to transits the polymeric resin into a low-viscosity state. A substrate strip, which has been assembled with a plurality of semiconductor chips connected to the substrate by bonding wires, is placed on a station also heated to the transition temperature. The wheel is then moved to roll the low viscosity resin on the chips and wires along the strip, while the inert film is separated. The chips and wires are thus encapsulated.

It is a technical advantage that the invention eliminates a number of perennial shortcomings of the conventional molding technology. Since the method allows the encapsulation not only of a substrate strip, but of whole substrate sheets, the invention lends itself to high encapsulation productivity. Since the deposition of the low viscosity, cream-like resin is gentle on the bonding wires, the invention eliminates wire sweep. Since the soft resin fills any space of the chip assembly, the invention eliminates any incomplete fill and trapped air observed in the traditional mold flow. And since the resin is soft, the invention eliminates chip cracks due to the high compound pressure in transfer molding.

BRIEF DESCRIPTION OF THE DRAWING

FIG. 1 illustrates schematically an apparatus to deposit, by the roll-on method of a wheel, a layer of low-viscosity adhesive resin on the bonding wires connecting semiconductor chips to a substrate, thereby encapsulating chips and wires. The chip attach compound forms a meniscus around the chip periphery.

DETAILED DESCRIPTION OF THE PREFERRED EMBODIMENTS

The schematic FIG. 1 depicts in simplified manner an apparatus, generally designated 100, for executing the encapsulation method of semiconductor devices according to the invention. In FIG. 1, a plurality of semiconductor chips 101 with terminals 102 is assembled on an insulating substrate strip 110. In FIG. 1, substrate 110 is shown as a strip; alternatively, the substrate may be a sheet, on which the chips are arranged in a two-dimensional array. A variety of materials may be used as base material for the substrate. When the overall device thickness has to be kept at a low value, substrate 110 may be a plastic foil made of a polyimide compound in the thickness range from about 40 to 80 μm. Alternatively, substrate may be a somewhat thicker insulating board made of ceramic or FR-4. Integral with substrate 110 are conductive traces and through-holes; substrate 110 further has metallic contact pads 111 on its surface of chip attachment, suitable for metallic wire attachment, and metallic pads on the opposite surface (pads not shown in FIG. 1), suitable for solder attachment.

The assembly on insulating substrate 110 includes adhesive polymeric compounds 104 to attach chips 101 to the substrate. Preferred choices for the adhesive compounds include epoxy-based and polyimide-based formulations, which have been mixed with catalysts (for alternative attachment materials and processes see FIG. 2). In order to improve the thermal conductivity of the adhesive compounds, the formulations include silver fillers between 50 and 80 volume %.

In FIG. 1, the meniscus 104a indicates that chips 101 have been attached by the method of placing drops of the semi-liquid compound on the substrate; the substrate is held at ambient temperature. By pressing the chips onto the drops, the liquid spreads under the chip area to form a fillet layer with a meniscus around the chip perimeter. The attachment process continues by raising the temperature to about 100° C. in order to drive the solvents out of the fillet layer; dependent on the chip size, this process step may last between about 10 min and 6 hours. By further raising the temperature to about 175 to 200° C. and keeping it for about 30 to 60 min, the polymer is allowed to cure by cross-linking (polymerization phase).

As FIG. 1 shows, the chip terminals 102 are connected to the substrate contact pads 111 by bonding wires 120. The preferred wire metal is gold or a gold alloy; alternatively, it may be copper or a copper alloy. The preferred bonding technique is ball bonding using a bonder with wires in the diameter range between 15 and 33 μm, preferably 20 to 25 μm; for power devices, thicker wires with diameters of about 50 μm may be used. From the length of the gold wire protruding from the bonder capillary, a free air ball with a preferred diameter from about 1.2 to 1.6 wire diameters is formed. On a pedestal heated to a temperature between 150 and 270° C., the free air ball is placed on the terminal 102 and pressed against the metallization of the pad. The capillary is lifted and the wire is moved towards the pad 111 forming an arch, which spans the gap between terminals 102 and pad 111. The wire is attached to pad 111 by stitch bonding. The bonders are controlled to place adjacent arches in an orderly pattern, free of disturbances, at a minimum distance of at least two wire diameters.

As FIG. 1 further shows, apparatus 100 includes a flat station 130, onto which substrate 110 with the attached and wire-bonded chips can be placed. Station 130 can be heated to temperatures of about 300° C.; it may further be helpful for some process steps described below, if station 130 (together with substrate 110) can be moved laterally in the direction indicated by arrow 131.

For the method according to the invention, a tape is provided, which includes a layer 140 of an adhesive polymeric resin and a film 141 of an inert plastic compound. Layer 140 has preferably a thickness between about 300 and 900 μm, and film 141 has preferably a thickness between about 25 and 40 μm. The thickness of layer 140 depends on the thickness of the chips (for many products between 100 and 275 μm) and the arch height of the bonding wires. The resin of layer 140 is an epoxy formulation mixed with a catalyst (so-called B-stage resin), which exhibits the Theological phases of melting and hardening (curing) within certain temperature ranges. Tapes of the described configurations are commercially available, for instance from Nippon Steel Chemical, Japan.

At ambient temperature, the viscosity of the resin of layer 140 is high, for example approximately 800 k Pa·s. With increasing temperature, the resin transverses the melting phase; the resin viscosity decreases with increasing temperature to reach about 8 k Pa·s at about 70° C. and about 800 Pa·s at about 90° C. The resin retains the low viscosity between the temperatures of about 90 and 130° C. At the low viscosity, the resin behaves like cream. At temperatures higher than about 130° C., the viscosity starts to increase again, because the resin enters the curing phase. At about 200° C., the resin's viscosity is again about 800 k Pa·s.

The epoxy resin of layer 140 further has a high volume (between about 70 and 80%) of silica filler in order to lower the CTE of the pure epoxy (about 70 ppm) to a CTE of about 10 ppm. Layer 140 is electrically insulating. Furthermore, the epoxy resin of layer 140 exhibits strong adhesion to the substrate materials frequently used in semiconductor devices, such as polyimide, FR-4, leadframes, and solder mask. In shear tests, the adhesive strength has been measured between 25 and 40 N·mm$^{-2}$.

In the encapsulation method, layer 140 is heated to the low-viscosity state of the resin and laminated on the bonding wires and chips. For a small number of chips, the lamination process can be performed manually. The preferred lamination method uses the apparatus 100 depicted in FIG. 1. In the apparatus, substrate 110, with the chips 101 attached to the substrate and the chip terminals 102 electrically connected to the substrate pads 111 by bonding wires 120, is placed on heatable station 130. As FIG. 1 shows, the bonding wires 120 face away from substrate 110.

Apparatus 100 includes a heatable wheel 150, which can rotate around its axis, as indicated by arrow 151 in FIG. 1, and further can be moved in x-, y-, and z-directions. Next, the lamination tape including adhesive resin layer 140 and inert film 141 is provided. A portion of the tape is placed around wheel 150 so that inert film 141 touches the wheel and resin layer 140 faces away from the wheel. In the next step, wheel 150 and station 130 are heated to a temperature suitable to transform the polymeric resin of layer 140 to a low-viscosity state. As mentioned above, the preferred temperature range is between about 70 and 130° C., and the more preferred temperature range is between about 80 and 90° C. Wheel 150 with the tape is moved above one end of substrate strip 110 so that the polymeric layer 140 faces the wire arches of the wire-bonded chips.

Wheel 150 with the tape is lowered until the low-viscosity resin 140 touches the wires of the first chip. The wheel is then lowered gently further until resin 140 completely immerses the chip and the wires in the cream-like resin with little disturbance to the wire bonds. The pressure on the wires is about 0.2 MPa. The wheel is then rolled forward along the strip to immerse the adjacent wires and chips in resin 140, while at the same time film 141 is separated from the deposited resin 140 (see portion 141a in FIG. 1). The pressure on the wires remains about 0.2 MPa. The preferred speed of the lateral movement of the wheel (x-direction) is between about 40 and 100 mm/s. In this manner, the chips and wires of the assembled plurality of chips are encapsulated and the flat surface 140a of the deposited resin is exposed. If desirable, station 131 may also be moved in the direction indicated by arrow 131.

Experience has shown that the roll-on lamination method using the cream-like resin of layer 140 encapsulates the chips and wires without entrapped voids and without deflected wires. The process delivers no observable wire sweep and wire disturbance, even when extended sheets of substrates with a plurality of assembled chips are processed in batch encapsulation.

In the next process step, the polymeric resin is hardened (cured) by cross-linking the molecules. This step is preferably performed in two phases: In the first phase, the temperature of station 130 is raised to the range of 150 to 160° C.; this phase of polymerization lasts for about 1 hour. The time can be shortened to about 10 min, when the temperature raised to around 180° C. Thereafter, in the second phase, the substrate with the encapsulated chips is removed from station 130 and brought into an oven, where the resin can be fully cured (hardened) at 180° C. for about 1 hour. Consequently, the total time for the two-step curing phase is 2 hours or less, a significant improvement over the 6 to 7 hours needed for curing the molding compounds in the conventional transfer molding method.

The substrate strip with the plurality of wire-bonded chips in hardened encapsulation is then submitted to the device singulation step, which is preferably performed by sawing. After the sawing process, the discrete devices are in a hard package, which has saw marks at the package sides from the cutting saw. The package sides are free of protrusions.

The encapsulation method of the invention can be coordinated with a chip attach process different from the one used for the chips in FIG. 1. A preferred method deposits the attachment compound as a tape to the whole semiconductor wafer. The tape has an adhesive film with a thickness in the range from 30 to 130 μm, and a composition of 30 weight % epoxy resin and 70 weight % silica filler (in contrast to the silver-filled chip attach material 104). The film is protected by an inert cover film. Such tapes are commercially offered, for example by Nippon Steel Chemical, Japan, under the brand name NEX-130. During the deposition on the wafer, the epoxy film has low viscosity because it is at a temperature of about 90 to 130° C. After deposition, the wafer is placed on a dicing tape and singulated by a saw into discrete chips with the adhesive film attached. Due to the sawing process, the attachment compound has edges in straight contour with the chip edges.

From the dicing tape, the singulated chips are lifted, one by one, and placed onto substrate 110, to which they adhere. The substrate together with the attached chips is then brought to a temperature between about 150 and 160° C. for a first phase of epoxy curing (for about one hour). Thereafter, the chip attach layer is stable enough to allow the process steps of wire bonding as described above. The second phase for completing the epoxy curing is performed concurrently with the curing of the polymeric resin of layer 140 described above.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the invention applies to any type of semiconductor chip, discrete or integrated circuit, and the material of the semiconductor chip may include silicon, silicon germanium, gallium arsenide, or any other semiconductor or compound material used in integrated circuit manufacturing.

As another example, the invention applies also to devices, for which manufacturing cost is a supreme concern. An example for cost-sensitive products are the smart card modules; they require manufacturing by low-cost batch processing. Some of these products may have additional priorities such as the thinness of the products, or the flexibility for reacting quickly to market requirements. These concerns can by satisfied simultaneously by the method of the invention.

It is therefore intended that the appended claims encompass any such modifications or embodiments.

I claim:

1. A method for fabricating a semiconductor device comprising the steps of:

placing a substrate strip with a plurality of semiconductor chips, connected to the substrate by bonding wires, on a heatable station so that the wires face away from the substrate;

placing a tape including a layer of an adhesive polymeric resin and a film of an inert plastic compound around a heatable wheel so that the layer faces away from the wheel;

heating the wheel and the substrate to a temperature suitable to transform the polymeric resin to a low-viscosity state; and rolling the wheel from one end of the substrate strip along the strip to deposit the low-viscosity resin on the chips and wires, thereby encapsulating the chips and wires.

2. The method of claim 1 further including the step of separating the inert film concurrently with depositing the resin.

3. The method of claim 2 further including the steps of: hardening the polymeric resin at elevated temperatures; and singulating the substrate strip into discrete encapsulated devices.

4. The method of claim 3 wherein the step of singulating is performed by sawing.

* * * * *